United States Patent
Chen et al.

(10) Patent No.: US 10,134,703 B2
(45) Date of Patent: Nov. 20, 2018

(54) PACKAGE ON-PACKAGE PROCESS FOR APPLYING MOLDING COMPOUND

(71) Applicant: Taiwan Semiconductor Manufacturing Company, Ltd., Hsin-Chu (TW)

(72) Inventors: Meng-Tse Chen, Changzhi Township (TW); Wei-Hung Lin, Xinfeng Township (TW); Sheng-Yu Wu, Hsin-Chu (TW); Bor-Ping Jang, Chu-Bei (TW); Ming-Da Cheng, Jhubei (TW); Chung-Shi Liu, Hsin-Chu (TW); Hsiu-Jen Lin, Zhubei (TW); Wen-Hsiung Lu, Jhonghe (TW); Chih-Wei Lin, Zhubei (TW); Yu-Peng Tsai, Taipei (TW); Kuei-Wei Huang, Hsin-Chu (TW); Chun-Cheng Lin, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/494,069

(22) Filed: Sep. 23, 2014

(65) Prior Publication Data
US 2015/0008581 A1 Jan. 8, 2015

Related U.S. Application Data

(62) Division of application No. 13/118,108, filed on May 27, 2011, now Pat. No. 8,927,391.

(51) Int. Cl.
*H01L 23/00* (2006.01)
*H01L 21/56* (2006.01)
(Continued)

(52) U.S. Cl.
CPC ............ *H01L 24/17* (2013.01); *H01L 21/565* (2013.01); *H01L 21/566* (2013.01);
(Continued)

(58) Field of Classification Search
CPC ..... H01L 24/17; H01L 21/565; H01L 21/566; H01L 23/3114; H01L 25/105; H01L 25/50
(Continued)

(56) References Cited

U.S. PATENT DOCUMENTS 5,045,914 A * 9/1991 Casto ................. H01L 23/3107
257/686
5,239,198 A 8/1993 Lin et al.
(Continued)

FOREIGN PATENT DOCUMENTS

CN 101421835 4/2009
CN 102104035 6/2011

OTHER PUBLICATIONS www.amkor.com, "Laminate Data Sheet, Package on Package (PoP) Family," May 2010, 4 pgs.
(Continued)

*Primary Examiner* — Ori Nadav
(74) *Attorney, Agent, or Firm* — Slater Matsil, LLP (57) ABSTRACT

A method of packaging includes placing a package component over a release film, wherein solder regions on a surface of the package component are in physical contact with the release film. Next, A molding compound filled between the release film and the package component is cured, wherein during the step of curing, the solder regions remain in physical contact with the release film.

20 Claims, 7 Drawing Sheets

(51) Int. Cl.
*H01L 25/10* (2006.01)
*H01L 25/00* (2006.01)
H01L 23/31 (2006.01)
H01L 23/498 (2006.01)

(52) U.S. Cl.
CPC ........ *H01L 23/3114* (2013.01); *H01L 25/105* (2013.01); *H01L 25/50* (2013.01); *H01L 23/3128* (2013.01); *H01L 23/49827* (2013.01); *H01L 24/16* (2013.01); *H01L 24/81* (2013.01); *H01L 2224/131* (2013.01); *H01L 2224/16055* (2013.01); *H01L 2224/16113* (2013.01); *H01L 2224/16146* (2013.01); *H01L 2224/16225* (2013.01); *H01L 2224/16227* (2013.01); *H01L 2225/1023* (2013.01); *H01L 2225/1058* (2013.01); *H01L 2924/014* (2013.01); *H01L 2924/01029* (2013.01); *H01L 2924/12042* (2013.01); *H01L 2924/1304* (2013.01); *H01L 2924/14* (2013.01); *H01L 2924/1432* (2013.01); *H01L 2924/1434* (2013.01); *H01L 2924/15174* (2013.01); *H01L 2924/15311* (2013.01); *H01L 2924/15321* (2013.01); *H01L 2924/181* (2013.01)

(58) Field of Classification Search
USPC ......... 257/738, 778, 780; 438/108, 121–127, 438/456
See application file for complete search history.

(56) References Cited

U.S. PATENT DOCUMENTS

| | | | |
|---|---|---|---|
| 5,450,283 A * | 9/1995 | Lin .................. | H01L 21/563 174/16.3 |
| 5,616,958 A * | 4/1997 | Laine ................ | H01L 21/563 257/673 |
| 5,728,606 A | 3/1998 | Laine et al. | |
| 5,784,782 A | 7/1998 | Boyko et al. | |
| 5,844,315 A * | 12/1998 | Melton ............. | H01L 21/568 257/666 |
| 5,994,166 A | 11/1999 | Akram et al. | |
| 6,126,885 A | 10/2000 | Oida et al. | |
| 6,214,525 B1 | 4/2001 | Boyko et al. | |
| 6,229,215 B1 | 5/2001 | Egawa | |
| 6,287,892 B1 | 9/2001 | Takahashi et al. | |
| 6,329,692 B1 * | 12/2001 | Smith ............... | H01L 27/0251 257/255 |
| 6,489,676 B2 | 12/2002 | Taniguchi et al. | |
| 6,507,107 B2 | 1/2003 | Vaiyapuri | |
| 6,838,761 B2 * | 1/2005 | Karnezos .......... | H01L 23/3128 257/659 |
| 7,439,101 B2 | 10/2008 | Shimonaka et al. | |
| 7,549,460 B2 * | 6/2009 | East ................. | F28F 3/022 165/104.33 |
| 7,667,338 B2 * | 2/2010 | Lin .................. | H01L 21/50 257/686 |
| 7,772,692 B2 * | 8/2010 | Takamatsu ........ | H01L 23/367 174/16.3 |
| 7,811,903 B2 | 10/2010 | Grigg et al. | |
| 8,084,854 B2 * | 12/2011 | Pratt ................ | H01L 21/76898 257/621 |
| 8,148,806 B2 | 4/2012 | Lin et al. | |
| 8,309,403 B2 * | 11/2012 | Feron ............... | H01L 21/561 257/619 |
| 8,481,366 B2 | 7/2013 | Harayama et al. | |
| 8,508,954 B2 | 8/2013 | Kwon et al. | |
| 2001/0014523 A1 | 8/2001 | Bessho | |
| 2004/0145051 A1 * | 7/2004 | Klein ............... | H01L 21/563 257/734 |
| 2005/0104172 A1 | 5/2005 | Awujoola et al. | |
| 2006/0033193 A1 | 2/2006 | Suh et al. | |
| 2008/0042279 A1 | 2/2008 | Bang et al. | |
| 2008/0050901 A1 | 2/2008 | Kweon et al. | |
| 2008/0154095 A1 | 6/2008 | Stubkjaer et al. | |
| 2009/0086451 A1 | 4/2009 | Kim et al. | |
| 2009/0154182 A1 | 6/2009 | Veenstra et al. | |
| 2011/0156237 A1 | 6/2011 | Gulpen et al. | |

OTHER PUBLICATIONS

"TMVTM PoP Thru-Mold Via Package on Package, Introducing TMV PoP Amkor's Next Generation 3D Packaging Solution, " www.amkor.com, printed May 13, 2014, no other date available; 1 pg.

www.statschippac.com, "PoP Package-on-Package: VFBGA-PoPb-SDx, L/TFBGA-PoPt-SDx," Mar. 2010, 2 pgs.

* cited by examiner

PACKAGE ON-PACKAGE PROCESS FOR APPLYING MOLDING COMPOUND

PRIORITY CLAIM AND CROSS-REFERENCE

This application is a divisional of U.S. patent application Ser. No. 13/118,108, entitled "Package-on-Package Process for Applying Molding Compound," filed on May 27, 2011, which application is incorporated herein by reference.

BACKGROUND

In a conventional package-on-package (POP) process, a top package, in which a first device die is bonded, is further bonded to a bottom package. The bottom package may also be bonded with a second device die. As a result, the second device die may be on the same side of the bottom package as the solder balls that are used to bond the bottom package to the top package.

Before the bonding of the top package to the bottom package, a molding compound is applied on the bottom package, with the molding compound covering the second device die and the solder balls. Since solder balls are buried in the molding compound, a laser ablation or drilling is performed to form holes in the molding compound, so that the solder balls are exposed. The top package and the bottom package may then be bonded through the solder balls in the bottom package.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package-on-package (PoP) bonding method and the resulting package structure are provided in accordance with various embodiments. The intermediate stages of manufacturing a package structure in accordance with an embodiment are illustrated. The variations of the embodiments are then discussed. Throughout the various views and illustrative embodiments, like reference numbers are used to designate like elements.

Figure 1:
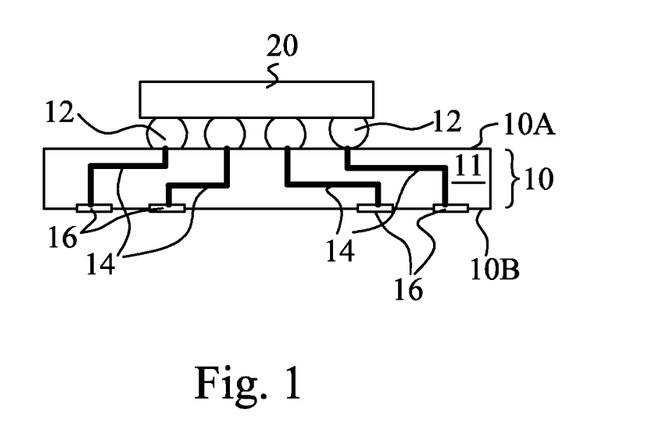
FIGS. 1 through 4 are cross-sectional views of intermediate stages in the formation of a top package in accordance with an embodiment.

Referring to FIG. 1, package component 10 is provided. Package component 10 may comprise substrate 11 that is formed of a semiconductor material, such as silicon, silicon germanium, silicon carbide, gallium arsenide, or other commonly used semiconductor materials. Alternatively, substrate 11 is formed of a dielectric material. Package component 10 is configured to electrically couple metal bumps 12 on first surface 10A to metal features such as bond pads 16 on second surface 10B opposite first surface 10A. Accordingly, package component 10 may include metal lines/vias 14 therein. In an embodiment, package component 10 is an interposer. In alternative embodiments, package component 10 is a package substrate.

Die 20 is bonded to package component 10 through metal bumps 12. Metal bumps 12 may be solder bumps or other types of metallic metal bumps. Throughout the description, metal bumps 12 are alternatively referred to as solder bumps 12. Die 20 may be a device die comprising integrated circuit devices, such as transistors, capacitors, inductors, resistors (not shown), and the like, therein. Furthermore, die 20 may be a logic die comprising core circuits, and may be, for example, a center computing unit (CPU) die, or a memory die. The bonding between die 20 and metal bumps 12 may be a solder bonding or a direct metal-to-metal (such as a copper-to-copper) bonding. An underfill (not shown) may be dispensed into the gaps between die 20 and package component 10.

Figure 2:
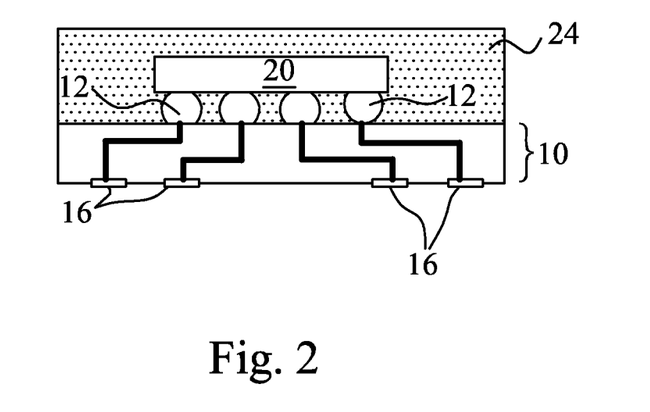
Figure 3:
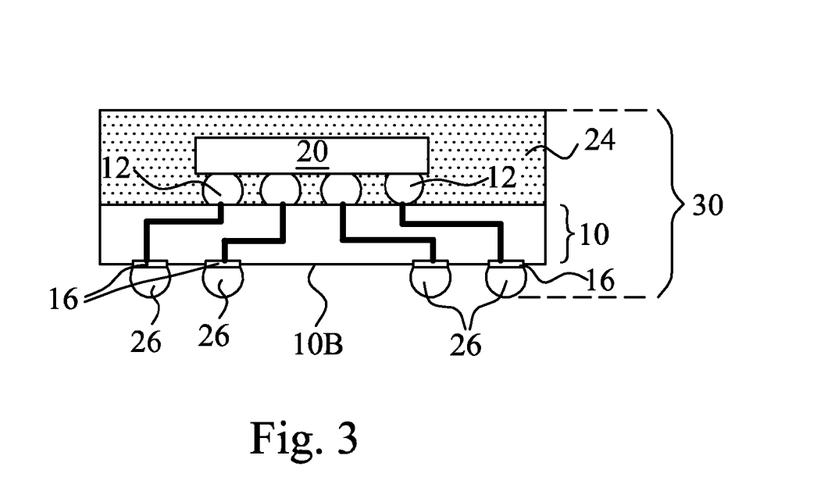
Figure 4:
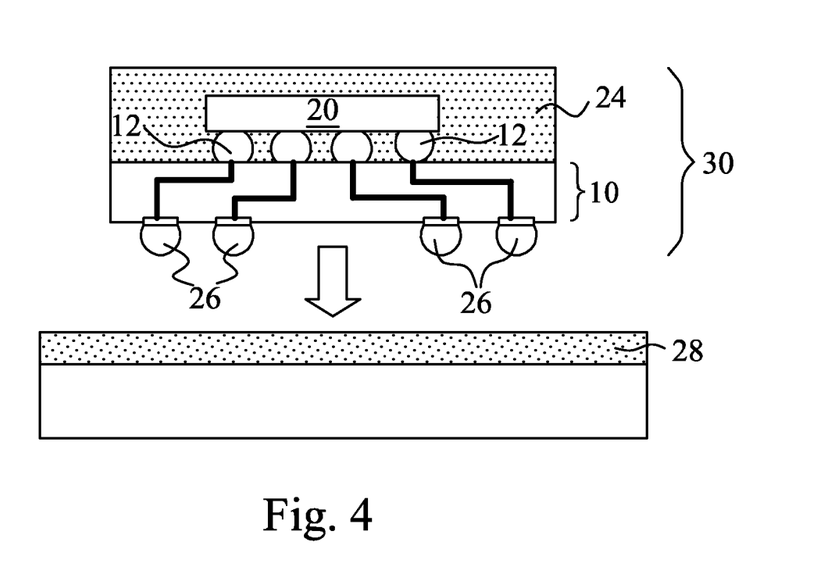

Referring to FIG. 2, molding compound 24 is molded onto die 20 and package component 10 using, for example, compressive molding or transfer molding. Accordingly, die 20 is protected by molding compound 24. In FIG. 3, solder balls 26 are mounted on bond pads 16 on surface 10B of package component 10. Solder balls 26 and die 20 may be on opposite sides of package component 10. A reflow is performed on solder balls 26. Top package 30 is thus formed. Next, as shown in FIG. 4, a flux dipping is performed to apply flux/solder paste 28 onto solder balls 26.

Figure 5:
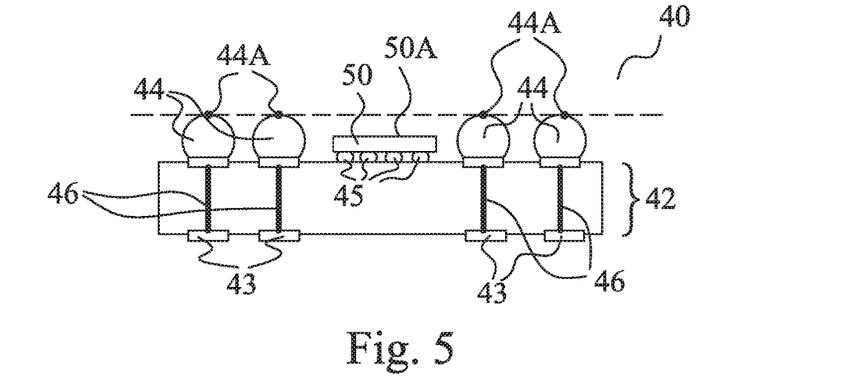
FIGS. 5 through 7 are cross-sectional views of intermediate stages in the formation of a bottom package in accordance with an embodiment, wherein a compressive molding method is used to apply a molding compound.

Referring to FIG. 5, bottom package 40 is formed. Bottom package 40 includes package component 42, which may be an interposer, a package substrate, or the like. Package component 42 is configured to electrically couple solder balls 44 and/or metal bumps 45 at the top surface to bond pads 43, which is at a bottom surface of package component 42. The metal connections from metal bumps 45 to solder balls 44 and/or bond pads 43 are not shown, although they may also exist. Furthermore, package component 42 may include metal lines and vias, both shown as 46, therein.

Die 50 is bonded to package component 42 through metal bumps 45. Metal bumps 45 may be solder bumps or other types of metallic metal bumps. Die 50 may be a device die such as a logic die or a memory die. The bonding between die 50 and bumps 45 may be a solder bonding or a direct metal-to-metal (such as a copper-to-copper) bonding. An underfill (not shown) may be dispensed into the gaps between die 50 and package component 42. Solder balls 44 may be mounted on the same side of package component 42 as die 50. Solder balls 44 have great sizes, so that the top ends 44A of solder balls 44 may be higher than top surface 50A of die 50.

Figure 6:
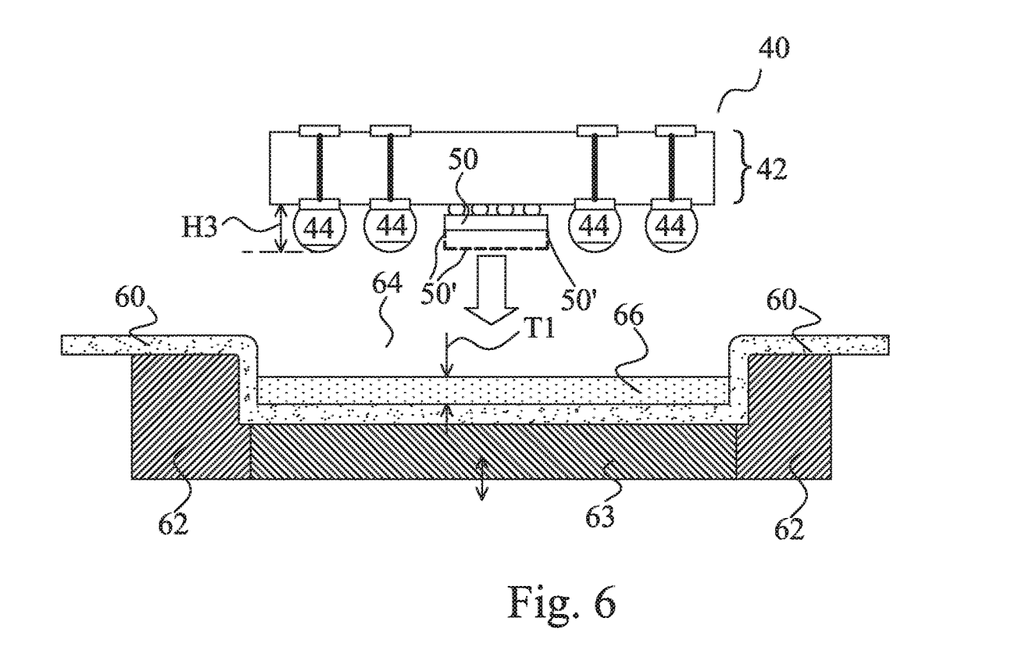
Figure 7:
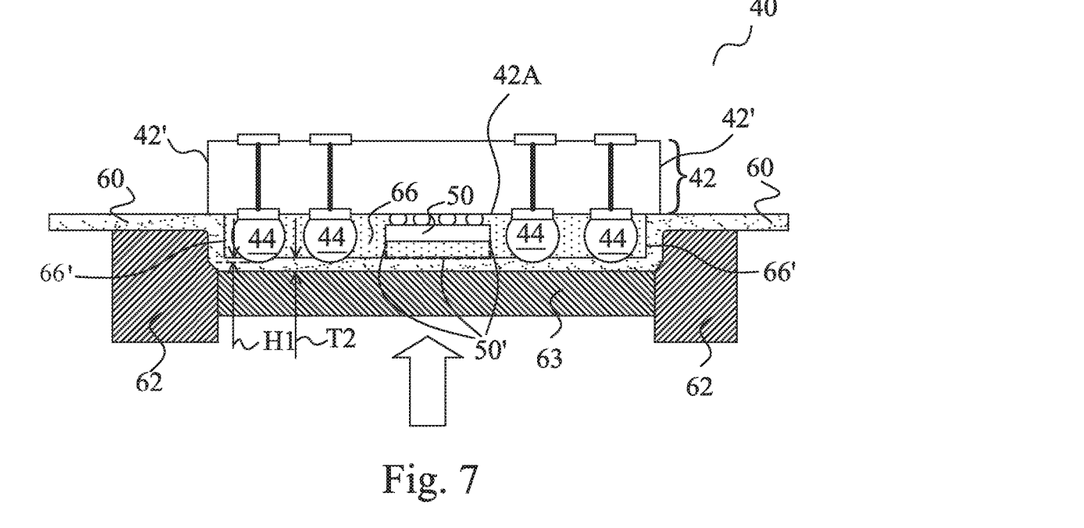

FIGS. 6 and 7 illustrate the cross-sectional views of intermediate stages in a compressive molding to apply molding compound 66 on package 40. Molding compound 66 may be a resin or other types of dielectric encapsulating material. Referring to FIG. 6, a part of mould 62, which is part of compressive molding apparatus, is illustrated. Mould 62 is configured to be heated to desirable temperatures. Cavity 64 is formed in mould 62. Movable compression block 63 is under cavity 64, and is configured to be moved up and down, as symbolized by the arrows, so that the depth of cavity 64 may be changed.

Release film 60 is placed on mould 62, and extends into cavity 64. Release film 60 is relatively soft, so that when solder balls are pressed into it, the solder balls are not damaged, and the solder balls may substantially maintain their shapes. Release film 60 may be a fluorine-base film, a silicon-coated polyethylene terephthalate film, a polymethylpentene film, a polypropylene film, or the like. Mould 62 may comprise small holes (not shown), so that when vacuumed, release film 60 may have good contact with movable compression block 63, the sidewalls of mould 62 (in cavity 64), and the top surfaces of mould 62. Accordingly, substantially no air bubble is formed between release film 60 and mould 62, and between release film 60 and movable compression block 63. Release film 60 also forms a cavity, which is also shown as cavity 64. Molding compound 66, which is in a liquid form, is placed in cavity 64 and over release film 60. Bottom package 40 is then placed over cavity 64, with die 50 and solder balls 44 facing cavity 64.

Referring to FIG. 7, device die 50 and solder balls 44 are placed into cavity 64. Movable compression block 63 may also be pushed upwardly, so that molding compound 66 is pushed up to fill in the spaces between solder balls 44, and fill in the space between die 50 and solder balls 44. Molding compound 66 may also be in physical contact with surface 42A of package component 42. The amount of molding compound and the respective thickness T1 (FIG. 6) is controlled, so that solder balls 44 penetrate through molding compound 66, with solder balls 44 at least in physical contact with release film 60. In an embodiment, solder balls 44 are pressed against release film 60, with a first portion of each of solder balls 44 pressed into release film 60. A second portion of each of solder balls 44 is not pressed into release film, so that they are inside and in contact with molding compound 66. As shown in FIG. 6, depth T1 of molding compound 66 pre-placed in cavity 64 may be smaller than height H3 of solder balls 44. Die 50, on the other hand, may, or may not, be in physical contact with release film 60. In FIG. 7, lines 50' are drawn to mark the left side, the right side, and the bottom side of die 50' when the bottom side is in contact with release film 60. In an embodiment, die 50 does not penetrate into release film 60. As shown in FIG. 7, the sidewalls 42' of package component 42 are vertically misaligned with the respective sidewalls 66' of molding compound 66, and sidewalls 42' are closer to the center axis (not shown) of package component 42 than sidewalls 66'. Accordingly, the distance between opposite sidewalls 66' is smaller than the distance between opposite sidewalls 42'.

Molding compound 66 is then cured, for example, by heating mould 62. During the curing step, solder balls 44 remain in physical contact with release film 60, and solder balls 44 may also remain to be pressed into release film 60. After the heating to cure molding compound 66, bottom package 40 is separated from release film 60. The resulting bottom package 40 is illustrated in FIG. 8.

Figure 8:
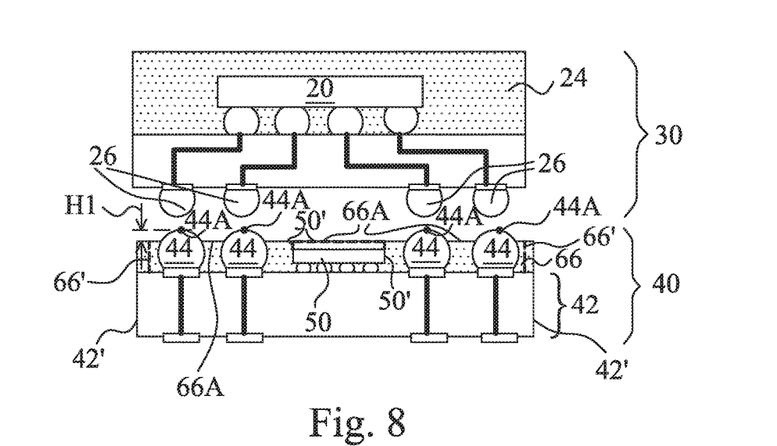
FIGS. 8 and 9 illustrate the bonding of the top package to the bottom package.

As shown in FIG. 8, the portions of solder balls 44 that are in contact with, and possibly pressed into, release film 60 when the curing is performed do not have molding compound 66 thereon. The cured molding compound 66 has top surface 66A, which may be substantially flat. Top ends 44A of solder balls 44 may be at least level with, and may be higher than, top surfaces 66A. Accordingly, all solder balls 44 are exposed through cured molding compound 66. Die 50 may be buried under a thin layer of molding compound 66. Alternatively, die 50 may be exposed and having a top surface level with top surface 66A of molding compound 66. Accordingly, during the molding step as shown in FIG. 7, the top surface (which is the bottom surface in FIG. 7) is in contact with release film 60. Since release film 60 is soft, pressing solder balls 44 will not cause significant change in the shape of solder balls 44, and the shape of the exposed portions of solder balls 44 may remain to be substantially rounded.

Figure 9:
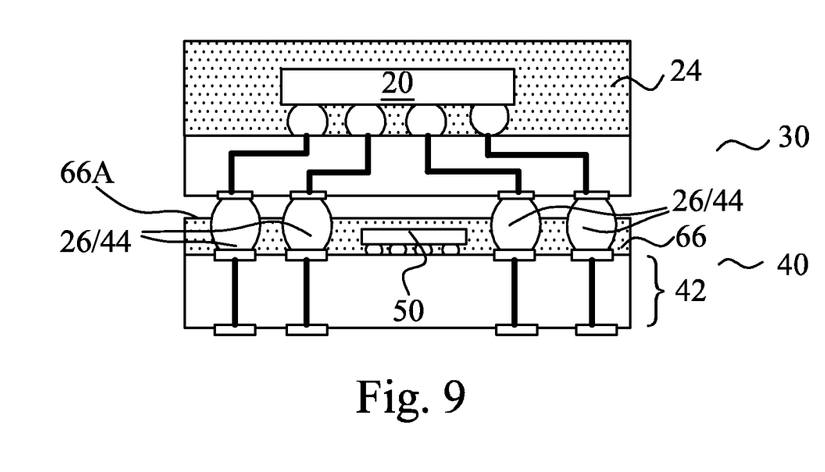

As also shown in FIG. 8, top package 30 as formed in the step shown in FIG. 4 is placed over bottom package 40. Since the compression molding in accordance with embodiments results in solder balls 44 to be exposed already, there is no need to performing a laser ablation or drilling to expose solder balls 44 from molding compound 66. Next, as shown in FIG. 9, solder balls 26 in top package 30 (please refer to FIG. 8) are placed against, and in contact with corresponding solder balls 44. A reflow is performed, so that solder balls 44 and 26 are melted to form combined solder bumps (denoted as 26/44).

Figure 10:
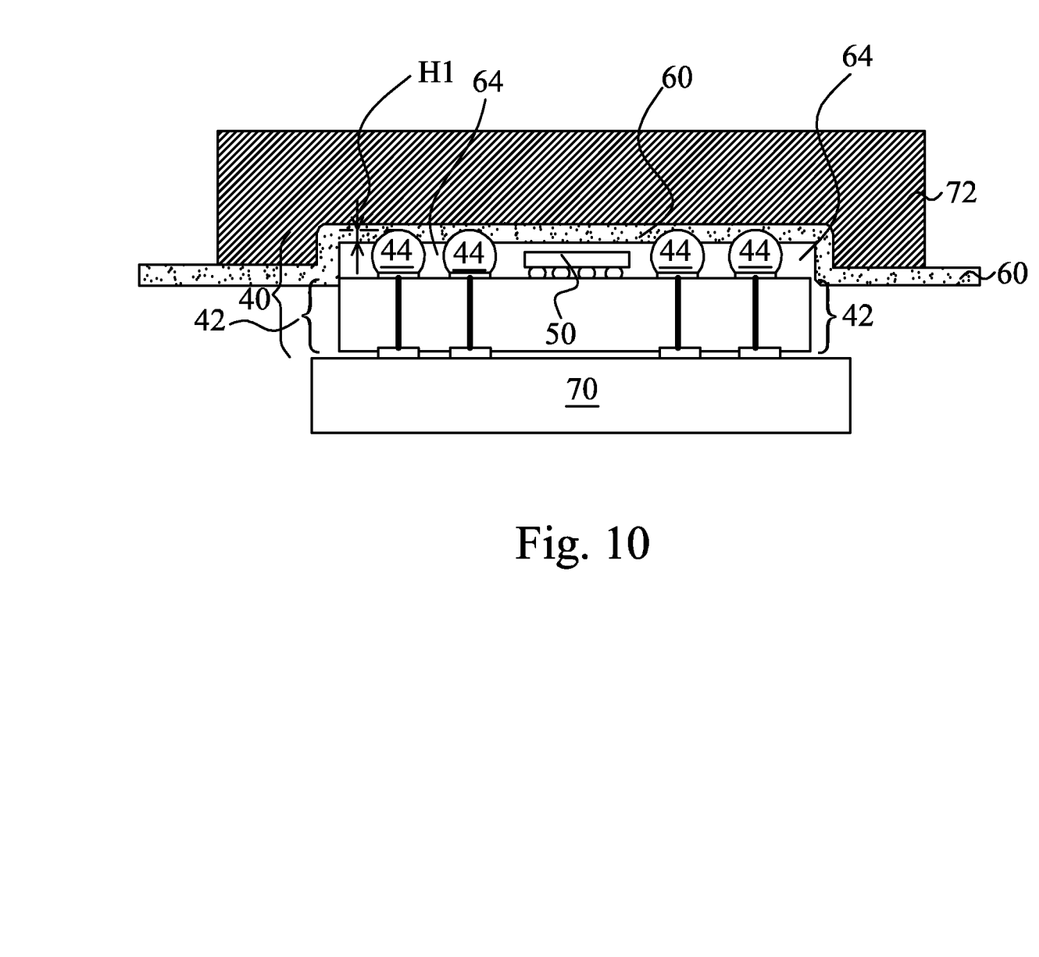
FIGS. 10 and 11 are cross-sectional views of intermediate stages in the formation of a bottom package in accordance with an alternative embodiment, wherein a transfer molding method is used to apply a molding compound.
Figure 11:
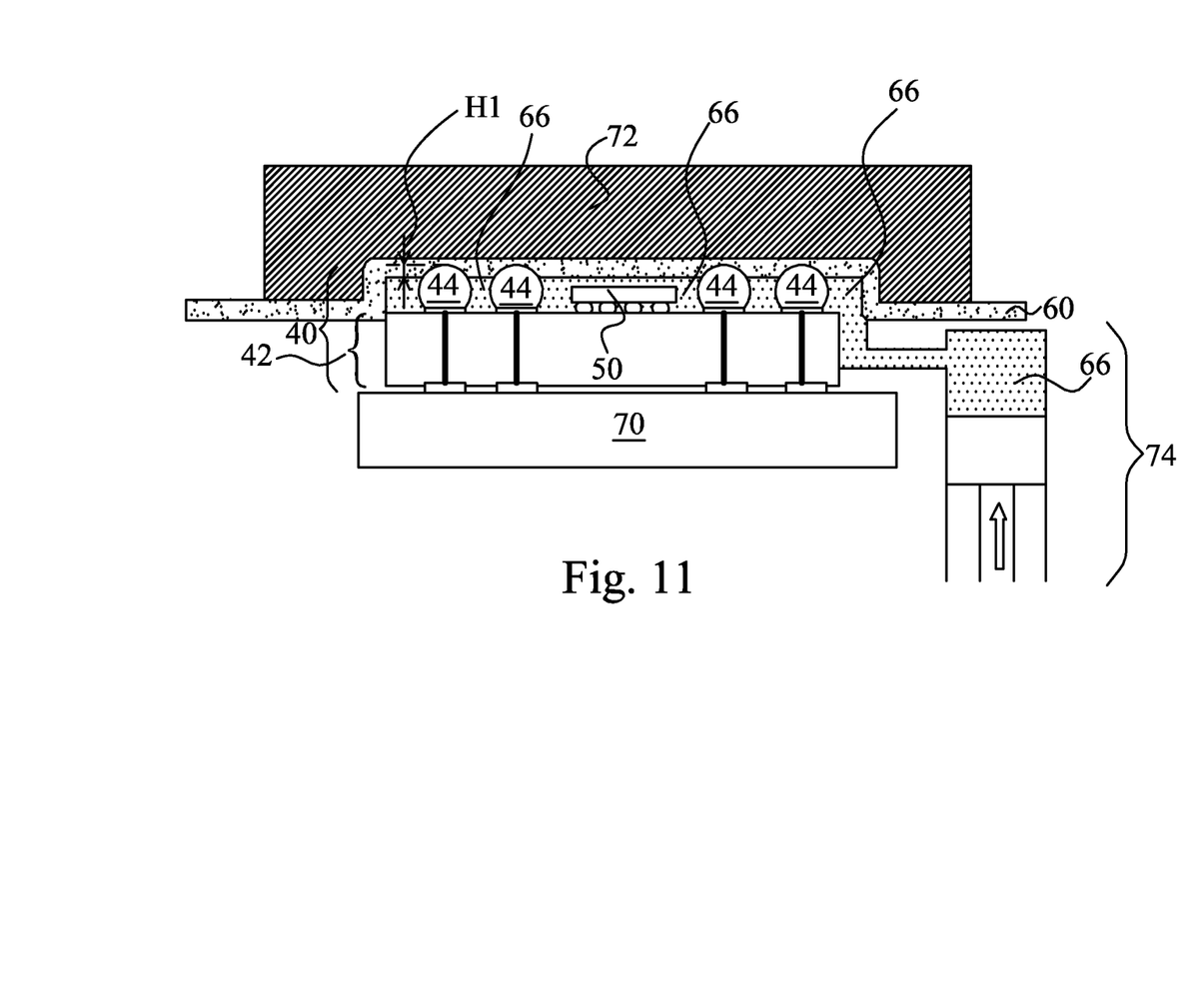

FIGS. 10 and 11 illustrate the molding of molding compound 66 to package component 42 in accordance with alternative embodiments, in which molding compound 66 is molded onto package component 42 through transfer molding. Unless specified otherwise, the reference numerals in these embodiments represent like elements in the embodiments illustrated in FIGS. 1 through 9. The initial steps of this embodiment are essentially the same as shown in FIGS. 1 through 5. Next, as shown in FIG. 10, bottom package component 42 is placed on lower chassis 70 of a transfer molding equipment. Solder balls 44 face up. Release film 60 is placed over and in contact with solder balls 44. Upper chassis 72 is used to suck up and hold release film 60, which forms cavity 64. Cavity 64 may be essentially the same as cavity 64 in FIG. 6, except cavity 64 faces downwardly in FIG. 10. Solder balls 44 are pressed against release film 60, and a portion of each of solder balls 44 may be pressed into release film 60. The portions of solder balls 44 pressed into release film 60 have height H1. Die 50, on the other hand, may, or may not, be in physical contact with release film 60.

Next, as shown in FIG. 11, the air in cavity 64 is vacuumed. Molding compound 66 is then injected into cavity 64 using plunger 74, and molding compound 66 fills the spaces between package component 42, solder balls 44, die 50, and release film 60. A heating is then performed, so that molding compound 66 is cured. Bottom package 40, which now comprises molding compound 66 thereon, is then separated from release film 60. The resulting package 40 is essentially the same as shown in FIG. 8. The steps as shown in FIGS. 8 and 9 may then be performed to finish the packaging of packages 30 and 40.

By using the embodiments, after molding compound 66 is molded on package component 42, solder balls 44 are already exposed through molding compound 66. Accordingly, the step of laser ablation or drilling is saved. The manufacturing cost is reduced, and the manufacturing throughput is enhanced.

In accordance with embodiments, a method of packaging includes placing a package component over a release film, wherein solder balls on a surface of the package component are in physical contact with the release film. Next, A molding compound filled between the release film and the package component is cured, wherein during the step of curing, the solder balls remain in physical contact with the release film.

In accordance with other embodiments, a method includes providing a bottom package including a package component, a solder ball mounted over a top surface of a package component, and a device die over and bonded to the top surface of the package component. The solder ball has a top end higher than a top surface of the device die. The package component is pressed against a release film, so that a first portion of the solder ball is pressed into the release film, and a second portion of the solder ball is outside the release film. The release film forms a cavity, with the solder ball being in the cavity. A molding compound is filled into the cavity. The molding compound in the cavity is cured, wherein during the step of curing, the first portion of the solder ball remains inside the release film.

In accordance with yet other embodiments, a package includes a package component, a plurality of solder balls over and mounted onto a surface of the package component, and a molding compound over the surface of the package component. Portions of the molding compound between the plurality of solder balls have top surfaces that are lower than top ends of the plurality of solder balls.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
   a package component comprising a first plurality of conductive pads at a top surface of the package component, a second plurality of conductive pads at a bottom surface of the package component, and metal lines and vias electrically connecting the first plurality of conductive pads to the second plurality of conductive pads;
   a device die over and bonded to the top surface of the package component;
   a plurality of solder regions, each of the plurality of solder regions having a bottom surface contacting a corresponding one of the first plurality of conductive pads, each of the plurality of solder regions being the same material; and
   a molding compound over the top surface of the package component and encircling the device die, wherein top ends of the plurality of solder regions are over a top surface of the molding compound, wherein each of the solder regions of the plurality of solder regions comprises a single continuous solder layer extending from a corresponding one of the first plurality of conductive pads to above the molding compound, wherein the molding compound has a substantially planar top surface extending from the device die to the plurality of solder regions, and the substantially planar top surface of the molding compound contacts a top corner of the device die, and wherein the package component has the top surface comprising a first portion in direct contact with the molding compound, and an entirety of a second portion not overlapped by the molding compound, wherein the second portion converges at a corner with an outer sidewall of the package component, the outer sidewall being free from overlying conductive material.

2. The package of claim 1, wherein the plurality of solder regions comprises top portions over the top surface of the molding compound, and top surfaces of the top portions are rounded.

3. The package of claim 2, wherein the plurality of solder regions comprises sidewalls in contact with the molding compound, and the sidewalls are smoothly connected to the top surfaces of the top portions.

4. The package of claim 3, wherein the sidewalls and the top surfaces of the top portions of the plurality of solder regions form continuous rounded profiles.

5. The package of claim 1, wherein top surfaces of the molding compound between the plurality of the solder regions are coplanar with each other.

6. The package of claim 1 further comprising:
   an additional package bonded to the plurality of solder regions, wherein the plurality of solder regions comprises smooth and rounded sidewalls in contact with the molding compound.

7. The package of claim 6, wherein the additional package comprises:
   a substrate; and
   an additional device die bonded to the substrate, wherein the top surface of the molding compound is spaced apart from the substrate of the additional package by a space.

8. The package of claim 1, wherein a top surface of the device die is coplanar with the top surface of the molding compound, and the device die is exposed through the molding compound.

9. The package of claim 1, wherein first sidewalls of the molding compound is vertically misaligned with corresponding second sidewalls of the package component.

10. A package comprising:
    a package substrate comprising a first plurality of conductive pads at a top surface of the package substrate, a second plurality of conductive pads at a bottom surface of the package substrate, and metal lines and vias electrically connecting the first plurality of conductive pads to the second plurality of conductive pads;
    a device die over and bonded to the package substrate;
    a plurality of solder regions, each over and physically contacting one of the first plurality of conductive pads, wherein entireties of the solder regions are over the respective ones of the first plurality of conductive pads, each of the plurality of solder regions being the same material; and
    a molding compound molding bottom portions of the plurality of solder regions therein, with top portions of the plurality of solder regions protruding over a top surface of the molding compound, wherein the plurality of solder regions has rounded sidewalls, wherein the molding compound has a substantially planar top surface extending from the device die to the plurality of solder regions, the substantially planar top surface being perpendicular to an outer sidewall of the molding compound, and the substantially planar top surface of the molding compound contacts a top corner of the device die, and wherein the package substrate has the top surface comprising a first portion in direct contact with the molding compound, and a second portion not overlapped by the molding compound, wherein the second portion converges with a sidewall of the package substrate at an outer corner of the package substrate, the sidewall being free from overlying conductive material.

11. The package of claim 10, wherein sidewalls of the plurality of solder regions are in contact with the molding compound.

12. The package of claim 10, wherein portions of the top surface of the molding compound between the plurality of the solder regions are leveled with each other.

13. The package of claim 10, wherein first sidewalls of the molding compound is vertically misaligned with corresponding second sidewalls of the package substrate.

14. A package comprising:
a first package comprising a package substrate comprising a plurality of conductive pads at a top surface of the package substrate, a device die over and bonded to the package substrate, and a molding compound molding the device die therein, wherein first outer sidewalls of the molding compound are vertically misaligned from corresponding second outer sidewalls of the package substrate, wherein the first outer sidewalls are perpendicular to the top surface of the package substrate, and wherein the package substrate has the top surface comprising a first portion in direct contact with the molding compound, and an entirety of a second portion not overlapped by the molding compound, wherein the second portion forms a corner with one of the corresponding second outer sidewalls, the one of the corresponding second outer sidewalls being a vertical sidewall located at an outermost periphery of the package substrate;
a plurality of solder regions in the first package, each of the plurality of solder regions being the same material, wherein each of the plurality of solder regions comprises:
    a bottom surface physically contacting a top surface of a corresponding one of the plurality of conductive pads, wherein each of the plurality of solder regions does not penetrate through the package substrate;
    smooth and rounded sidewalls in contact with the molding compound; and
    a top portion protruding out of the top surface of the molding compound, wherein the top portion has a rounded top surface smoothly connected to the smooth and rounded sidewalls, wherein a majority of each of the solder regions is in the molding compound.

15. The package of claim 14, wherein portions of the top surface of the molding compound between the plurality of the solder regions are leveled with each other.

16. The package of claim 14, wherein a top surface of the device die is coplanar with a top surface of the molding compound, and the top surface of the device die extends to top corners of the device die, and the device die is exposed through the molding compound.

17. The package of claim 14, wherein the solder regions comprise top portions protruding out of the molding compound, and the package further comprises a release film, with the top portions of the solder regions embedded in the release film.

18. The package of claim 14, wherein the plurality of solder regions does not extend into the package substrate.

19. The package of claim 14, wherein the molding compound has a substantially planar top surface extending from the device die to the plurality of solder regions.

20. The package of claim 14, wherein a first distance between opposite ones of the first outer sidewalls of the molding compound is smaller than a second distance between opposite ones of the corresponding second outer sidewalls of the package substrate.

* * * * *